United States Patent
Farrar

(10) Patent No.: US 6,872,671 B2
(45) Date of Patent: Mar. 29, 2005

(54) INSULATORS FOR HIGH DENSITY CIRCUITS

(75) Inventor: Paul A. Farrar, So. Burlington, VT (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 10/179,151

(22) Filed: Jun. 24, 2002

(65) Prior Publication Data

US 2002/0168872 A1 Nov. 14, 2002

Related U.S. Application Data

(62) Division of application No. 09/382,524, filed on Aug. 25, 1999.

(51) Int. Cl.⁷ .............................................. H01L 21/31
(52) U.S. Cl. ..................................................... 438/780
(58) Field of Search ................................ 438/619, 780, 438/781, 782, 778, 783

(56) References Cited

U.S. PATENT DOCUMENTS

| | | | |
|---|---|---|---|
| 3,506,438 A | 4/1970 | Krock et al. ................... 75/208 |
| 3,953,566 A | 4/1976 | Gore .......................... 264/288 |
| 3,956,195 A | 5/1976 | Topchiashvili et al. ..... 252/511 |
| 3,962,153 A | 6/1976 | Gore ........................ 260/2.5 R |
| 4,096,227 A | 6/1978 | Gore ...................... 264/210 R |
| 4,368,350 A | 1/1983 | Perelman ..................... 174/102 |
| 4,482,516 A | 11/1984 | Bowman et al. ............ 264/127 |
| 4,561,173 A | 12/1985 | Te Velde ..................... 438/619 |
| 4,599,136 A | 7/1986 | Araps et al. ................. 156/643 |
| 4,725,562 A | 2/1988 | El-Kareh et al. ............. 437/67 |
| 4,749,621 A | 6/1988 | Araps et al. ............. 428/473.5 |
| 4,962,058 A | 10/1990 | Cronin et al. ............... 437/187 |
| 5,128,382 A | * 7/1992 | Elliott et al. ................. 521/178 |
| 5,137,780 A | * 8/1992 | Nichols et al. .............. 428/336 |
| 5,158,986 A | 10/1992 | Cha et al. ....................... 521/82 |
| 5,158,989 A | 10/1992 | Ogitani et al. ................ 522/77 |
| 5,173,442 A | 12/1992 | Carey .......................... 437/173 |
| 5,227,103 A | 7/1993 | Muschiatti ................. 264/45.9 |
| 5,324,683 A | 6/1994 | Fitch et al. .................... 437/65 |
| 5,334,356 A | 8/1994 | Baldwin et al. ............. 422/133 |

(Continued)

FOREIGN PATENT DOCUMENTS

GB      2158995 A      11/1985      .......... H01Q/17/00

OTHER PUBLICATIONS

In: *Metals Handbook Ninth Edition, vol. 2 Properties and Selection: Nonferrous Alloys and Pure Metals*, ASM International,(1979),pp. 796–797.

"ACCUSPIN T–18 Flowable Spin–On Polymer (SOP)", *AlliedSignal—Advanced Microelectronic Materials*, Sunnyvale, CA,(7/98),pp. 1–2.

(Continued)

Primary Examiner—Long Pham
Assistant Examiner—Ginette Peralta
(74) *Attorney, Agent, or Firm*—Schwegman, Lunderg, Woessner & Kluth, P.A.

(57) ABSTRACT

A conductive system and a method of forming an insulator for use in the conductive system is disclosed. The conductive system comprises a foamed polymer layer on a substrate. The foamed polymer layer has a surface that is hydrophobic, and a plurality of conductive structures are embedded in the foamed polymer layer. An insulator is formed by forming a polymer layer having a thickness on a substrate. The polymer layer is foamed to form a foamed polymer layer having a surface and a foamed polymer layer thickness, which is greater than the polymer layer thickness. The surface of the foamed polymer layer is treated to make the surface hydrophobic.

39 Claims, 4 Drawing Sheets

U.S. PATENT DOCUMENTS

| | | | | |
|---|---|---|---|---|
| 5,340,843 A | | 8/1994 | Tsuruta et al. | 521/79 |
| 5,408,742 A | | 4/1995 | Zaidel et al. | 29/846 |
| 5,438,539 A | | 8/1995 | Mori | 365/159 |
| 5,449,427 A | | 9/1995 | Wojnarowski et al. | 156/155 |
| 5,470,693 A | | 11/1995 | Sachdev et al. | 430/315 |
| 5,470,802 A | * | 11/1995 | Gnade et al. | 438/781 |
| 5,473,814 A | | 12/1995 | White | 29/840 |
| 5,480,048 A | | 1/1996 | Kitamura et al. | 216/13 |
| 5,486,493 A | | 1/1996 | Jeng | 437/195 |
| 5,510,645 A | | 4/1996 | Fitch et al. | 257/522 |
| 5,548,159 A | | 8/1996 | Jeng | 257/634 |
| 5,552,638 A | * | 9/1996 | O'Connor et al. | 257/759 |
| 5,554,305 A | | 9/1996 | Wojnarowski et al. | 216/62 |
| 5,591,676 A | | 1/1997 | Hughes et al. | 437/195 |
| 5,593,926 A | | 1/1997 | Fujihira | 437/209 |
| 5,747,880 A | | 5/1998 | Havemann et al. | 257/759 |
| 5,780,121 A | | 7/1998 | Endo | 427/569 |
| 5,785,787 A | | 7/1998 | Wojnarowski et al. | 156/155 |
| 5,786,630 A | | 7/1998 | Bhansali et al. | 257/697 |
| 5,798,200 A | | 8/1998 | Matsuura et al. | 430/126 |
| 5,804,607 A | | 9/1998 | Hedrick et al. | 521/64 |
| 5,821,621 A | | 10/1998 | Jeng | 257/759 |
| 5,830,923 A | | 11/1998 | Venkataramm | 521/64 |
| 5,841,075 A | | 11/1998 | Hanson | 174/250 |
| 5,844,317 A | | 12/1998 | Bertolet et al. | 257/773 |
| 5,878,314 A | | 3/1999 | Takaya et al. | 399/302 |
| 5,879,787 A | | 3/1999 | Petefish | 428/209 |
| 5,879,794 A | | 3/1999 | Korleski | 428/317.1 |
| 5,891,797 A | | 4/1999 | Farrar | 438/619 |
| 5,912,313 A | | 6/1999 | McIntosh et al. | 526/279 |
| 5,923,074 A | | 7/1999 | Jeng | 257/522 |
| 5,926,732 A | | 7/1999 | Matsuura | 438/622 |
| 5,953,626 A | | 9/1999 | Hause et al. | 438/622 |
| 5,994,777 A | | 11/1999 | Farrar | 257/758 |
| 6,037,245 A | | 3/2000 | Matsuda | 438/586 |
| 6,037,249 A | | 3/2000 | Chiang et al. | 438/619 |
| 6,040,628 A | | 3/2000 | Chiang et al. | 257/760 |
| 6,043,146 A | | 3/2000 | Watanabe et al. | 438/623 |
| 6,071,600 A | | 6/2000 | Rosenmayer | 428/213 |
| 6,077,792 A | * | 6/2000 | Farrar | 438/780 |
| 6,130,140 A | | 10/2000 | Gonzalez | 438/430 |
| 6,165,890 A | | 12/2000 | Kohl et al. | 438/619 |
| 6,172,305 B1 | | 1/2001 | Tanahashi | 174/255 |
| 6,195,156 B1 | | 2/2001 | Miyamoto et al. | 355/85 |
| 6,245,658 B1 | * | 6/2001 | Buynoski | 438/619 |
| 6,265,303 B1 | | 7/2001 | Lu et al. | 438/623 |
| 6,268,637 B1 | | 7/2001 | Gardner et al. | 257/522 |
| 6,313,518 B1 | | 11/2001 | Ahn et al. | 257/632 |
| 6,323,125 B1 | | 11/2001 | Soo et al. | 438/645 |
| 6,331,480 B1 | | 12/2001 | Tsai et al. | 438/624 |
| 6,380,294 B1 | | 4/2002 | Babinec et al. | 524/440 |
| 6,433,413 B1 | | 8/2002 | Farrar | 257/678 |
| 6,503,818 B1 | | 1/2003 | Jang | 438/584 |
| 2001/0034117 A1 | | 10/2001 | Eldridge et al. | 438/619 |

OTHER PUBLICATIONS

"Packaging", *Electronic Materials Handbook, vol. 1*, ASM International,(1989),pp. 105, 768–769.

"Properties and Selection: Nonferrous Alloys and Pure Metals", *Metals Handbook Ninth Edition, vol. 2*, ASM International,(1979),pp. 157, 395.

Chiniwalla, N..,et al. ,"Structure–Property Relations for Polynorbornenes", *Proceedings from the Eighth Meeting of the Dupont Symposium on Polymides In Microelectronics*, (1998),pp. 615–642.

Conti, R..,et al. ,"Processing Methods to Fill High Aspect Ratio Gaps Without Premature Constriction", *1999 Proceedings of Dielectrics for Multilevel Interconnection Conference*, (1999),pp. 201–209.

Craig, J..D. ,"Polymide Coatings", *In: Packaging, Electronic Materials Handbook, vol. 1*, ASM International Handbook Committee (eds.), ASM International, Materials Park, OH,(1989),767–772.

Jayaraj, K..,et al. ,"Low Dielectric Constant Microcellular Foams", *Proceedings from the Seventh Meeting of the DuPont Symposium on Polymides in Microelectrics*, (Sep. 1996),pp. 474–501.

Jin, C..,et al. ,"Porous Xerogel Films as Ultra–low Permittivity Dielectrics for ULSI Interconnect Applications", *Conference Proceedings ULSI XII—1997 Materials Research Society*, (1997),pp. 463–469.

Miller, R..D. ,et al. ,"Low Dielectric Constant Polyimides and Polyimide Nanofoams", *Seventh Meeting of the DuPont Symposium on Polymides in Microelectronics*, (Sep. 1996), pp. 443–473.

Ramos, T.,et al. ,"Nanoporous Silica for Dielectric Constant Less Than 2", *Conference Proceedings ULSI XII—1997 Materials Research Society*, (1997),455–461.

Remenar, J..,et al. ,"Templating Nanopores into Poly (Methysilsesquioxane): New–Low Dielectric Coatings Suitable for Microelectronic Applications", *Materials Research Society Symposium Proceedings, 511*, (1998),pp. 69–74.

Shibasaki, T..,et al. ,"Process and Application of Fumed Silica AEROSIL", *3rd Annual Workshop on Mechanical Polishing*, Lake Placid, New York,(1998),pp. 1–27.

Singer, P.,"The new low–k candidate: It's a gas", *Semiconductor International, 22(3)*, (1999),p. 38.

Ting, C..H. ,"Low K Material/Process Development", *1996 VLSI Multilevel Interconnection State–of–the–Art Seminar*, (Jun. 1996),pp. 171–212.

Van Vlack, L..H. , *Elements of Materials Science*, Addison–Wesley Publishing Co., Inc. Reading, MA,(1959),p. 468.

Vardaman, E..J. ,"Future Packaging Trends: CSP vs. Flip Chip", *11th European Microelectrics Conference*, (1997), pp. 295–299.

Volksen, W..,et al. ,"Characterization and Processing Considerations for Methylsilsesquioxane Based Dialectricts", *Proceedings of the Fifth Dialectric for ULSI Multilevel Interconnections*, Santa Clara, CA,(1999),pp. 83–90.

Grove, N. , et al., "Functionalized Polynorbornene Dielectric Polymers: Adhesion and Mechanical Properties", *Journal of Polymer Science*, (1999), pp. 3003–3010.

Labadie, J. , et al., "Nanopore Foams of High Temperature Polymers", *IEEE Transactions on Components, Hybrids, and Manufacturing Technology, 15*, (Dec., 1992), pp. 925–930.

* cited by examiner

INSULATORS FOR HIGH DENSITY CIRCUITS

This application is a Divisional of U.S. Application No. 09/382,524, filed Aug. 25, 1999 which is incorporated herein.

FIELD OF THE INVENTION

This invention relates to high density integrated circuits, and more particularly to insulators used in high density circuits.

BACKGROUND OF THE INVENTION

Silicon dioxide is the most commonly used insulator in the fabrication of integrated circuits. As the density of devices, such as resistors, capacitors and transistors, in an integrated circuit is increased, several problems related to the use of silicon dioxide insulators arise. First, as metal signal carrying lines are packed more tightly, the capacitive coupling between the lines is increased. This increase in capacitive coupling is a significant impediment to achieving high speed information transfer between and among the integrated circuit devices. Silicon dioxide contributes to this increase in capacitive coupling through its dielectric constant, which has a relatively high value of four. Second, as the cross-sectional area of the signal carrying lines is decreased for the purpose of increasing the packing density of the devices that comprise the integrated circuit, the signal carrying lines become more susceptible to fracturing induced by a mismatch between the coefficients of thermal expansion of the silicon dioxide and the signal carrying lines.

One solution to the problem of increased capacitive coupling between signal carrying lines is to substitute a material for silicon dioxide that has a lower dielectric constant than silicon dioxide. Polyimide has a dielectric constant of between about 2.8 and 3.5, which is lower than the dielectric constant of silicon dioxide. Substituting polyimide for silicon dioxide lowers the capacitive coupling between the signal carrying lines. Unfortunately, there are limits to the extendibility of this solution, since there are a limited number of insulators that have a lower dielectric constant than silicon dioxide and are compatible with integrated circuit manufacturing processes.

One solution to the thermal expansion problem is to substitute a foamed polymer for the silicon dioxide. The mismatch between the coefficient of thermal expansion of a metal signal carrying line and the coefficient of thermal expansion a foamed polymer insulator is less than the mismatch between the coefficient of thermal expansion of a metal signal carrying line and the coefficient of thermal expansion of silicon dioxide. Unfortunately, a foamed polymer has the potential to adsorb moisture, which increases the dielectric constant of the foamed polymer and the capacitive coupling between the metal signal carrying lines. One solution to this problem is to package the integrated circuit in a hermetically sealed module. Unfortunately, this solution increases the cost of the integrated circuit.

For these and other reasons there is a need for the present invention.

SUMMARY OF THE INVENTION

The above mentioned problems with silicon dioxide insulators and other problems are addressed by the present invention and will be understood by reading and studying the following specification.

A conductive system and a method of forming an insulator for use in the conductive system is disclosed. The conductive system comprises a foamed polymer layer formed on a substrate. The foamed polymer layer has a surface that is hydrophobic. A plurality of conductive structures are embedded in the foamed polymer layer.

An insulator is formed by forming a polymer layer having a thickness on a substrate. The polymer layer is foamed to form a foamed polymer layer having a surface and a foamed polymer layer thickness, which is greater than the thickness of the polymer layer. The surface of the foamed polymer layer is treated to make the surface hydrophobic.

DETAILED DESCRIPTION OF THE PREFERRED EMBODIMENTS

In the following detailed description of the preferred embodiments, reference is made to the accompanying drawings which form a part hereof, and in which is shown by way of illustration specific preferred embodiments in which the invention may be practiced. These embodiments are described in sufficient detail to enable those skilled in the art to practice the invention, and it is to be understood that other embodiments may be utilized and that logical, mechanical and electrical changes may be made without departing from the spirit and scope of the present inventions. The following detailed description is, therefore, not to be taken in a limiting sense, and the scope of the present invention is defined only by the appended claims.

Figure 1A:
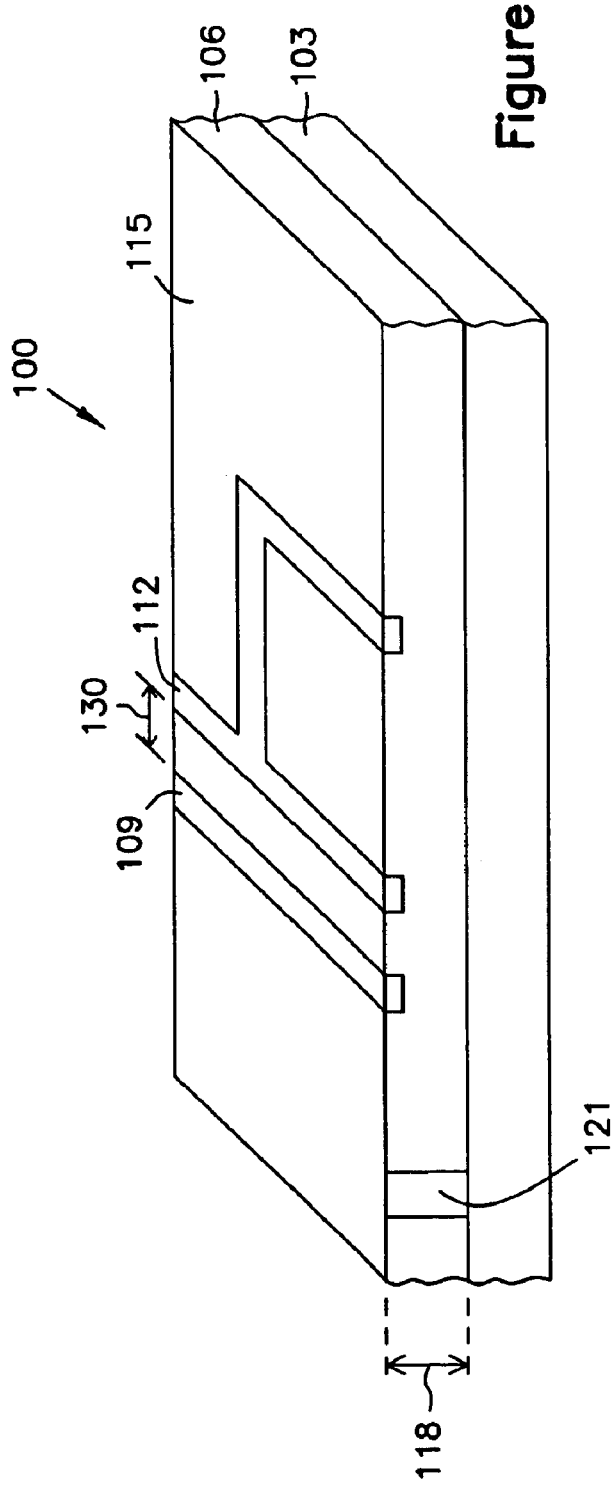
FIG. 1A is a perspective cross-sectional view of one embodiment of a conductive system of the present invention.

FIG. 1A is a perspective cross-sectional view of one embodiment of conductive system 100. Conductive system 100 includes substrate 103, foamed material layer 106, conductive structure 109, and conductive structure 112. Foamed material layer 106 is formed on substrate 103, and the plurality of conductive structures, conductive structure 109 and conductive structure 112, in one embodiment, are embedded in foamed material layer 106.

Substrate 103 is fabricated from a material, such as a semiconductor, that is suitable for use as a substrate in connection with the fabrication of integrated circuits. Substrate 103 includes doped and undoped semiconductors, epitaxial semiconductor layers supported by a base semiconductor or insulator, as well as other semiconductor structures having an exposed surface with which to form the conductive system of the present invention. Substrate 103 refers to semiconductor structures during processing, and may include other layers that have been fabricated thereon. In one embodiment, substrate 103 is fabricated from silicon. Alternatively, substrate 103 is fabricated from germanium, gallium-arsenide, silicon-on-insulator, or silicon-onsapphire. Substrate 103 is not limited to a particular material, and the material chosen for the fabrication of substrate 103 is not critical to the practice of the present invention.

Foamed material layer 106 is formed on substrate 103. Foamed material layer 106 includes surface 115, foamed thickness 118, and foamed section 121. In preparing to form foamed material layer 106, an unfoamed material layer is applied to the surface of substrate 103. In one embodiment, the unfoamed material layer is applied using a conventional photoresist spinner to form an unfoamed material layer. In one embodiment, the unfoamed material layer is fabricated from a polymer, such as polyimide or parylene containing silane, that is capable of being foamed to a foamed thickness 118 of about three times the starting thickness of the unfoamed polymer layer. Alternatively, the unfoamed material layer is a gel, such as an aerogel, that is capable of being foamed to an foamed thickness 118 of about three times the starting thickness of the unfoamed gel layer. In still another alternate embodiment, the unfoamed material layer is formed from a material that has a dielectric constant of less than about 1.8 after foaming and contains silane. After curing, the thickness of the unfoamed material layer is preferably between about 0.6 and 0.8 microns, which is less than foamed thickness 118. If a final thickness of the foamed material of 2.1 microns with a dielectric constant of 0.9 is required, then a thickness less than about 0.6 microns may result in insufficient structural strength, to support the conductive structures 109 and 112. A thickness of more than about 0.8 microns would result in a higher than desired dielectric constant.

After the unfoamed material layer is applied to substrate 103, an optional low temperature bake can be performed to drive off most of the solvents present in the unfoamed material layer. If needed, the unfoamed material layer is cured. If the unfoamed material layer is formed from an organic polymer, such as a polyimide, a fluorinated polyimide, or a fluro-polymer, curing the organic polymer results in the organic polymer developing a large number of cross-links between polymer chains. A variety of techniques are available for curing polymers. For example, many polymers are cured by baking in a furnace (e.g., at about a 350° Centigrade (C) to about 500° C.)) or heating on a hot plate to the same temperatures. Other polymers are cured by exposing them to visible or ultraviolet light. Still other polymers are cured by adding curing (e.g. cross-linking) agents to the polymer. Preferably, some types of polymers are most effectively cured using a process having a plurality of operations. For example, a curing process having a plurality of operations includes the operations of processing in the range of temperatures of between about 100° C. and about 125° C. for about 10 minutes, processing at about 250° C. for about 10 minutes, and processing at about 375° C. for about 20 minutes. Preferably, a hot plate is used in performing a curing process having a plurality of operations.

A supercritical fluid is utilized to convert at least a portion of the unfoamed material layer into foamed material layer 106. A gas is determined to be in a supercritical state (and is referred to as a supercritical fluid) when it is subjected to a combination of pressure and temperature such that its density approaches that of a liquid (i.e., the liquid and gas state coexist). A wide variety of compounds and elements can be converted to the supercritical state for use in forming foamed material layer 106.

Preferably, the supercritical fluid is selected from the group comprising ammonia ($NH_3$) an amine (e.g., $NR_3$), an alcohol (e.g., ROH), water ($H_2O$), carbon dioxide ($CO_2$), nitrous oxide ($N_2O$), noble gases (e.g. He, Ne, Ar), a hydrogen halide (e.g., hydrofluoric acid (HF), hydrochloric acid (HCl), or hydrobromic acid (HBr)), boron trichloride ($BCl_3$), chlorine ($Cl_2$), fluorine ($F_2$), oxygen ($O_2$), nitrogen ($N_2$), a hydrocarbon (e.g., methane ($CH_4$), ethane ($C_2H_6$), propane ($C_3H_8$), ethylene ($C_2H_4$), etc.), dimethyl carbonate ($CO(OCH_3)_2$), a fluorocarbon (e.g. $CF_4$, $C_2F_4$, $CH_3F$, etc.), hexfluoroacetylacetone ($C_5H_2F_6O_2$), and combinations thereof. Although these and other fluids are used as supercritical fluids, preferably a fluid with a low critical pressure, preferably below about 100 atmospheres, and a low critical temperature of about room temperature is used as the supercritical fluid. Further, it is preferred that the fluids be nontoxic and nonflammable. In addition, the fluids should not degrade the properties of the unfoamed material. Preferably, the supercritical fluid is $CO_2$ because it is relatively inert with respect to most polymeric materials. Furthermore, the critical temperature (about 31° C.) and critical pressure (about 7.38 MPascals (MPa), 72.8 atmospheres (atm)) of $CO_2$ are relatively low. Thus, when $CO_2$ is subjected to a combination of pressure and temperature above about 7.38 MPa (72.8 atm) and about 31° C., respectively, it is in the supercritical state.

The unfoamed material layer is exposed to the supercritical fluid for a sufficient time period to foam at least a portion of the unfoamed material layer to foamed thickness 118. Generally, substrate 103 is placed in a processing chamber and the temperature and pressure of the processing chamber are elevated above the temperature and pressure needed for creating and maintaining the particular supercritical fluid. After the unfoamed material layer is exposed to the supercritical fluid for a sufficient period of time to saturate the unfoamed material layer, the processing chamber is depressurized. Upon depressurization, the foaming of the unfoamed material layer occurs as the supercritical state of the fluid is no longer maintained.

The foaming of a particular material is assisted by subjecting the material to a thermal treatment, e.g., a temperature suitable for assisting the foaming process but below temperatures which may degrade the material. The depressurization to ambient pressure is carried out at any suitable speed, but the depressurization must at least provide for conversion of the polymeric material before substantial diffusion of the supercritical fluid out of the polymeric material occurs. Foaming of the unfoamed material layer occurs over a short period of time. The period of time that it takes for the saturated unfoamed material layer to be completely foamed depends on the type and thickness of the material and the temperature/pressure difference between the processing chamber and ambient environment. The specific time, temperature, and pressure combination used depends on the diffusion rate of the gas through the material and the thickness of the layer of material.

U.S. Pat. No. 5,334,356, Supermicrocellular Foamed Materials, Daniel F. Baldwin et al. and U.S. Pat. No. 5,158,986, Microcellular Thermoplastic Foamed With Supercritical Fluid, Cha et al. describe alternate supercritical fluid processes for foaming a material, which are suitable for use in connection with the present invention, and which are hereby incorporated by reference.

After completion of the foaming process, in one embodiment, foamed material layer 106 is exposed to a methane gas which has been passed through a plasma forming $CH_3$ and H radicals. The $CH_3$ radicals react with foamed material 106 at surface 115 making surface 115 hydrophobic.

Figure 1B:
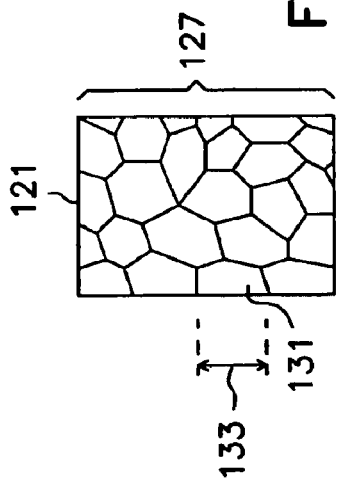
FIG. 1B is a enlarged view of a section of the foamed material of FIG. 1A.

FIG. 1B is a magnified view of foamed section 121 in foamed material layer 106 of FIG. 1A. Foamed section 121 is a cross-sectional view of a plurality of cells 127 that make up foamed section 121. Each of the plurality of cells 127 has a cell size. For example, cell 131 has cell size 133. The plurality of cells 127 has an average cell size. In one embodiment, the average cell size is less than distance 130 between conductive structure 109 and conductive structure 112 of FIG. 1A. If the average cell size is not less than distance 130 between conductive structure 109 and conductive structure 112, the microstructure of foamed material 106 is not sufficiently dense to support conductive structure 109 and conductive structure 112 of FIG. 1A. In one embodiment, the average cell size 133 is less than about one micron, and the average cell size is less than about one micron. Preferably, cell size 133 is less than about 0.1 microns and the average cell size is less than about 0.1 microns.

Referring again to FIG. 1A, conductive structure 109 and conductive structure 112 are embedded in foamed material layer 106. Prior to embedding conductive structure 109 and conductive structure 112 in foamed material layer 106, photoresist is applied to surface 115 of foamed material layer 106. In one embodiment, patterns for through holes and channels are formed in the resist using a gray mask pattern. Alternatively, two levels of photoprocessing are used to define the patterns. After photoprocessing, holes and channels are etched in foamed material layer 106. A metal, such as aluminum, copper, gold, silver, or tungsten or an alloy of aluminum, copper, gold, silver, or tungsten of sufficient thickness to fill the trenches and through holes is deposited on the surface of foamed material layer 106. Chemical mechanical polishing (CMP) can be used to remove the excess metal from surface 115. The process is repeated as many times as necessary to build a complete wiring structure.

Conductive system 100 has several advantages. First, the dielectric constant of foamed material layer 106 located between conductive structure 109 and conductive structure 112 is less than the dielectric constant of the commonly used silicon dioxide insulator. So, the information bandwidth of conductive structure 109 and conductive structure 112 is increased. Second, the surface of foamed polymer layer 106 is hydrophobic, which prevents moisture from accumulating in the interstices of foamed polymer layer 106 and increasing the dielectric constant. Third, forming foamed polymer layer 106 from a gel has the added advantage that a foamed gel has high thermal stability, so lower thermal stresses are exerted on conductive structures 109 and 112.

Figure 2:
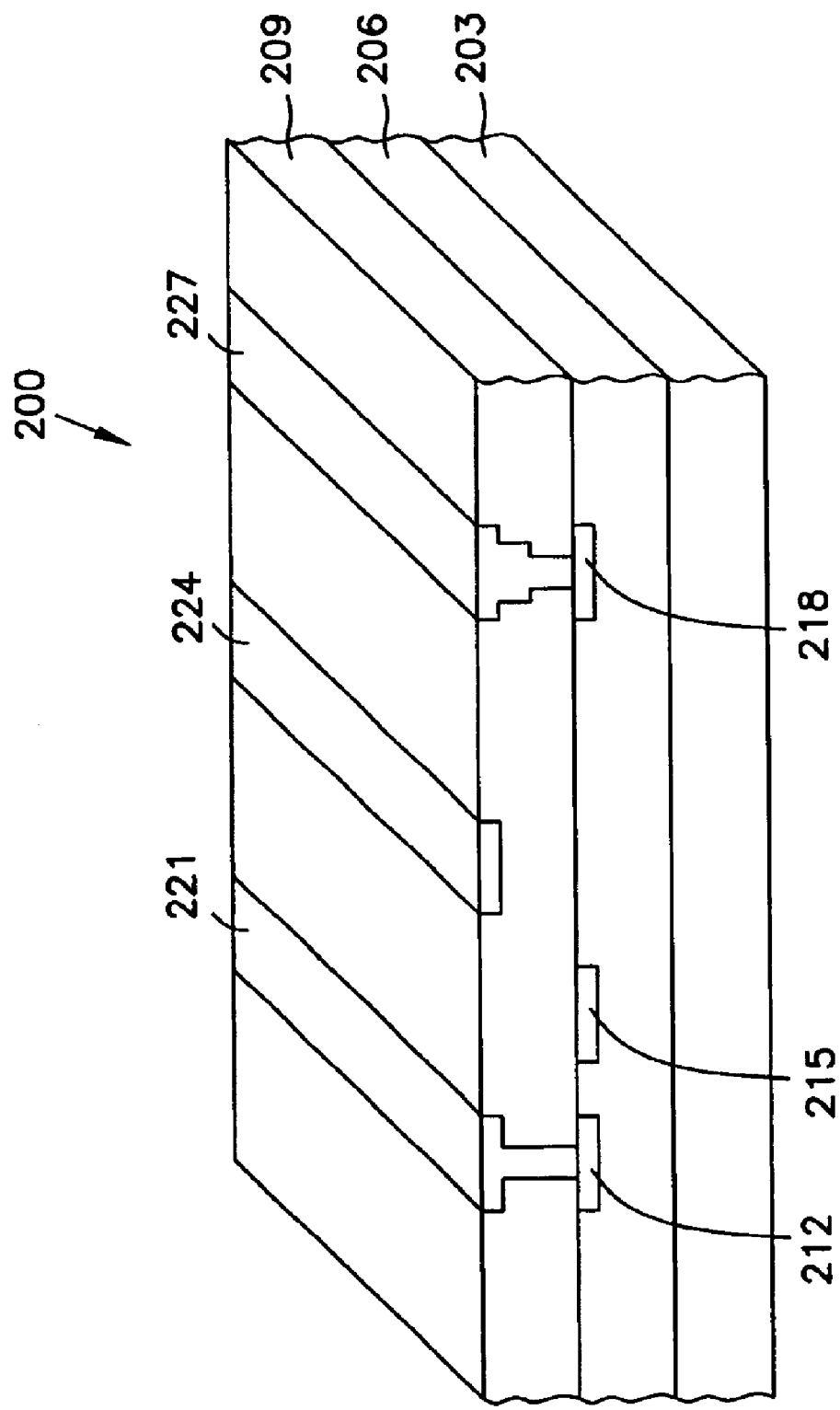
FIG. 2 is a perspective cross-sectional view of one embodiment of a plurality of stacked foamed polymer layers formed on a substrate.

FIG. 2 is a perspective cross-sectional view of one embodiment of a multilayer conductive system 200. Multilayer conductive system 200 includes substrate 203, foamed material layer 206, foamed material layer 209, first level conductive structures 212, 215, and 218, and second level conductive structures 221, 224, and 227. Foamed material layer 206 is formed on substrate 203. Foamed material layer 209 is formed on foamed material layer 206. First level conductive structures 212, 215, and 218 are embedded in foamed material layer 206, and second level conductive structures 221 224, and 227 are embedded in foamed material layer 209.

Substrate 203 provides a base for the fabrication of integrated circuits. Substrate 203 is fabricated from the same materials used in the fabrication of substrate 103 of FIG. 1 described above. Foamed material layer 206 and foamed material layer 209 are formed using the processes described above in forming foamed material layer 106 of FIG. 1.

First level conductive structures 212, 215, and 218, in one embodiment, are formed using conventional integrated circuit manufacturing processes. Second level conductive structures 221 and 227, in one embodiment, are formed using the dual damascene process. The dual damascene process is described in "Process for Fabricating Multi-Level Integrated Circuit Wiring Structure from a Single Metal Deposit", John E. Cronin and Pei-ing P. Lee, U.S. Pat. No. 4,962,058, Oct. 9, 1990, and is hereby incorporated by reference. An advantage of the present invention is that it is suitable for use in connection with the dual damascene process, which reduces the cost of fabricating multi-level interconnect structures in integrated circuits.

Figure 3:
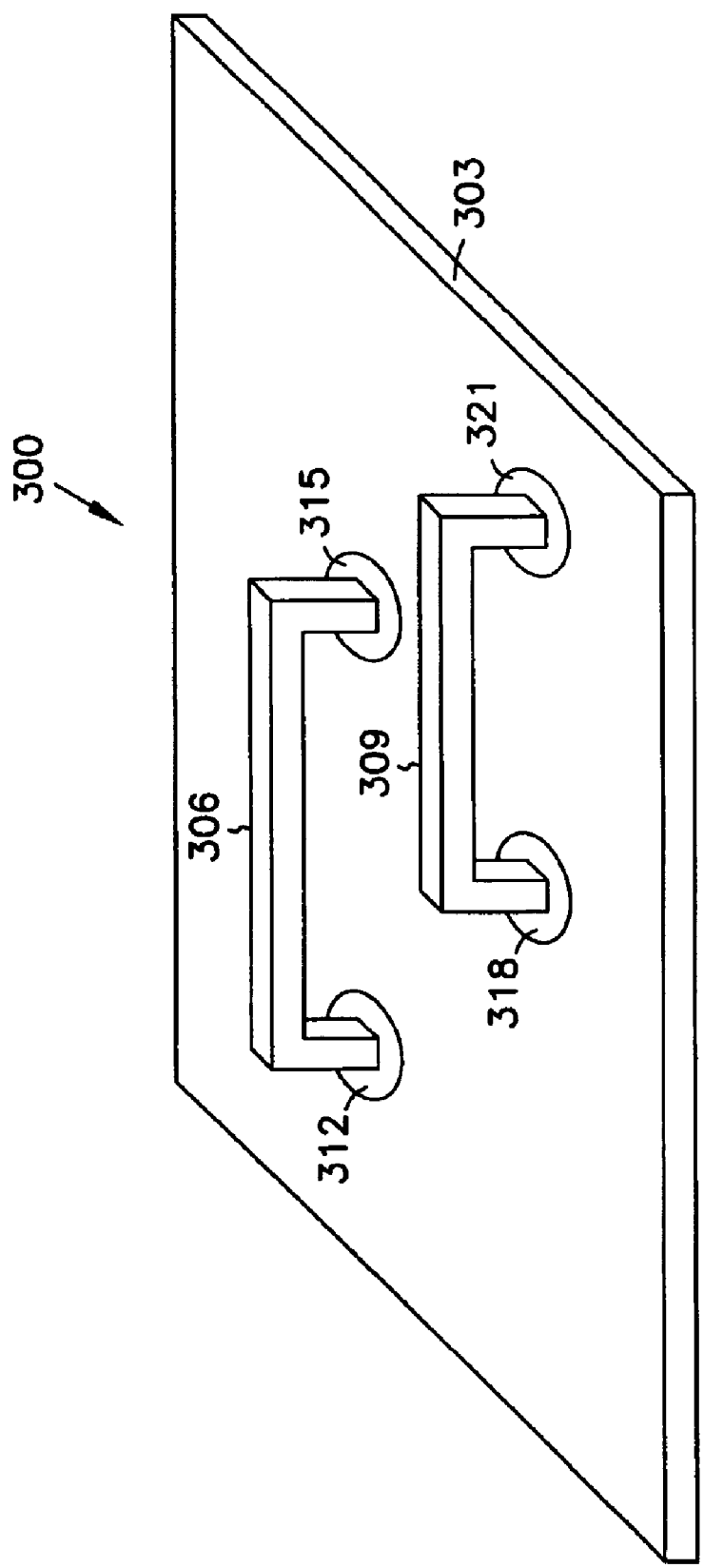
FIG. 3 is a perspective view of one embodiment of an air-bridge structure suitable for use in connection with the present invention.

FIG. 3 is a perspective view of one embodiment of air-bridge structure 300, which is suitable for use in connection with the present invention. Air-bridge structure 300 comprises substrate 303, air-bridge structure 306, air-bridge structure 309, and electronic devices 312, 315, 318, and 321. Electronic devices 312, 315, 318, and 321 are formed on substrate 303. Air-bridge structure 306 interconnects electronic devices 312 and 315, and air-bridge structure 309 interconnects electronic devices 318, and 321.

Substrate 303 provides a base for the fabrication of electronic devices. Substrate 303 is fabricated from the same materials used in the fabrication of substrate 103 of FIG. 1 described above.

Air-bridge structures 306 and 309 are conductive structures. Conductors suitable for use in the fabrication of air-bridge structures 306 and 309 include silver, aluminum, gold, copper, tungsten and alloys of silver, aluminum, gold, copper and tungsten. Air-bridge structures 306 and 309 are surround by air, which has a dielectric constant of about one, so the capacitance between air-bridge structure 306 and 309 is less than the capacitance between two similarly configured conductive structures embedded in silicon dioxide. Decreasing the capacitance between air bridge structure 306 and air-bridge structure 309 from about four to one allows the transmission of higher frequency signals between electronic devices 318 and 321 and electronic devices 312 and 315. The bandwidth is increased further by treating the surfaces of air-bridge structures 306 and 309 to make them hydrophobic. In one embodiment a method for treating the surfaces of air-bridge structures 309 and 312 comprises creating methane radicals by passing methane gas through a plasma forming $CH_3$ and H radicals and exposing the surfaces of air-bridge structures 309 and 312 to the radicals. The $CH_3$ radicals react with the surfaces of air-bridge structures 309 and 312 to make the surfaces hydrophobic. Alternatively, methane radicals are formed by exposing methane gas to a high frequency electric field.

Figure 4:
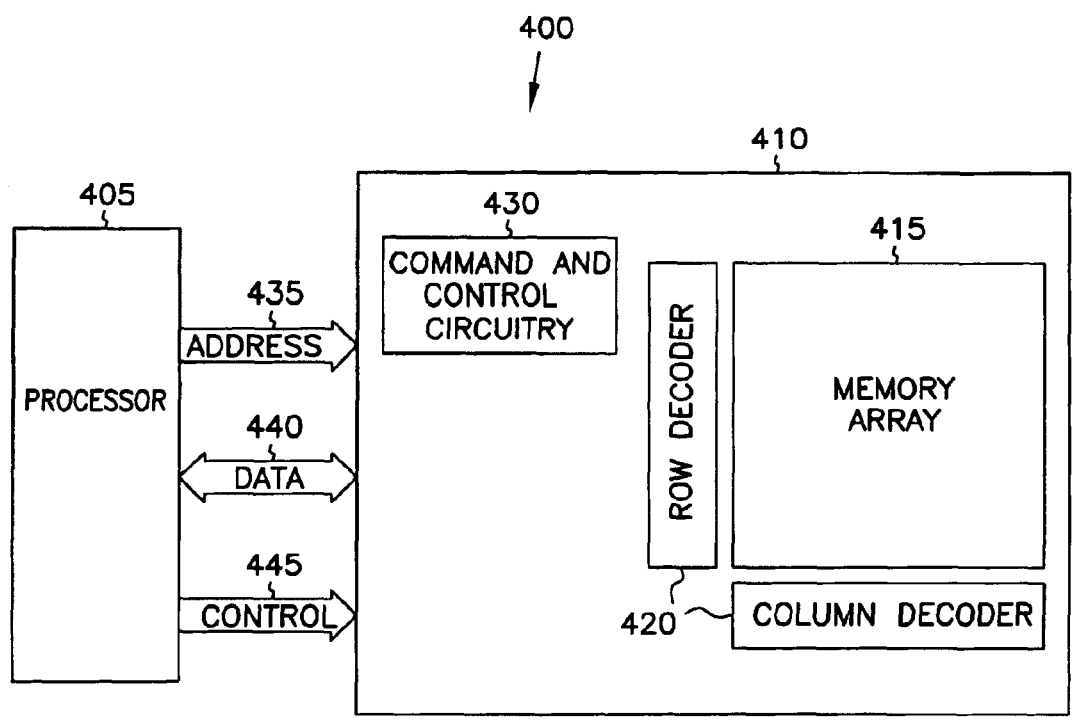
FIG. 4 is block diagram of a system level embodiment of a computer system suitable for use in connection with the present invention.

FIG. 4 is a block diagram of a computer system suitable for use in connection with the present invention. System 400 comprises processor 405 and memory device 410, which includes conductive structures of one or more of the types described above in conjunction with FIGS. 1–3. Memory device 410 comprises memory array 415, address circuitry 420, and read circuitry 430, and is coupled to processor 405 by address bus 435, data bus 440, and control bus 445. Processor 405, through address bus 435, data bus 440, and control bus 445 communicates with memory device 410. In a read operation initiated by processor 405, address information, data information, and control information are provided to memory device 410 through busses 435, 440, and 445. This information is decoded by addressing circuitry 420, including a row decoder and a column decoder, and read circuitry 430. Successful completion of the read operation results in information from memory array 415 being communicated to processor 405 over data bus 440.

Conclusion

An insulator for use in high density integrated circuits and a method of fabricating the insulator has been described. The insulator includes a foamed material layer having a surface treated to make it hydrophobic. The method of fabricating the insulator includes forming a material layer on a substrate, foaming the material layer to form a foamed material layer, and immersing the foamed material layer in a plasma of methane radicals to make the surface of the foamed material layer hydrophobic.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is intended that this invention be limited only by the claims and the equivalents thereof.

What is claimed is:

1. A method of forming an insulator comprising:
    forming a material layer having a material layer thickness on a substrate at provides a base for fabricating one or more integrated circuits;
    foaming the material layer to form a foamed material layer having a surface and a foamed thickness, the foamed thickness being greater than the material layer thickness;
    treating the surface to make the surface hydrophobic; and
    forming an interconnection conductive structure for the one or more integrated circuits in the foamed material layer.

2. The method of claim 1, wherein forming a material layer having a thickness on a substrate comprises:
    forming a polymer layer on the substrate.

3. The method of claim 1, wherein forming a material layer having a thickness on a substrate comprises:
    applying an aerogel to the substrate;
    spinning the substrate; and
    curing the aerogel such that, after curing, the thickness is between about 0.6 microns and about 0.8 microns.

4. A method of forming an insulator comprising:
    forming a polymer layer on a substrate that provides a base for fabricating one or more integrated circuits;
    foaming the polymer layer to form a foamed polymer layer having a surface and a foamed polymer dielectric constant between about 0.8 and about 1.0;
    treating the surface to make the surface hydrophobic; and
    forming an interconnection conductive structure for the one or more integrated circuits in the foamed polymer layer.

5. The method of claim 4, wherein forming a polymer layer on substrate comprises:
    depositing polyimide containing silane on the substrate.

6. The method of claim 4, wherein foaming the polymer layer to form a foamed polymer layer having a surface and a foamed polymer dielectric constant between about 0.8 and 1.0 comprises:
    forming a foamed polymer layer having a depth of between about 1.8 and 2.0 microns.

7. The method of claim 4, wherein treating the surface to make the surface hydrophobic comprises:
    flowing methane radicals over the surface.

8. A method of forming an insulator comprising:
    forming a polymer layer on a substrate that provides a base for fabricating one or more integrated circuits;
    foaming the polymer layer with a supercritical fluid to form a foamed polymer layer having a surface and a foamed polymer dielectric constant between about 0.8 and 1.0;
    treating the surface to make the surface hydrophobic; and
    forming an interconnection conductive structure for the one or more integrated circuits in the foamed polymer layer.

9. The method of claim 8, wherein forming a polymer layer on a substrate comprises:
    forming a polyimide layer on the substrate.

10. The method of claim 8, wherein foaming the polymer layer with a supercritical fluid includes exposing the polymer layer to a $CO_2$ supercritical fluid.

11. The method of claim 8, wherein foaming the polymer layer with a supercritical fluid includes exposing the polymer layer to a supercritical fluid with a critical pressure below about 100 atmospheres and a critical temperature of about room temperature.

12. The method of claim 8, wherein foaming the polymer layer with a supercritical fluid includes exposing the polymer layer to a supercritical fluid that is nontoxic and nonflammable.

13. The method of claim 8, wherein foaming the polymer layer with a supercritical fluid includes exposing the polymer layer to a supercritical fluid selected from a group comprising $NH_3$, $NR_3$, $ROH$, $H_2O$, $CO_2$, $N_2O$, $He$, $Ne$, $Ar$, $HF$, $HCl$, $HBr$, $BCl_3$, $Cl_2$, $F_2$, $O_2$, $N_2$, $CH_4$, $C_2H_6$, $C_3H_8$, $C_2H_4$, $CO(OCH_3)_2$, $CF_4$, $C_2F_4$, $CH_3F$, and $C_5H_2F_6O_2$.

14. The method of claim 8, wherein the method further includes depressurizing after exposing the polymer layer to the supercritical fluid at a rate such that the polymer layer converts to the foamed polymer layer before substantial diffusion of the supercritical fluid out of the polymer layer occurs.

15. A method of forming an insulator comprising:
    forming a polymer layer having a thickness on a substrate from a polymer having a silane additive, the substrate providing a base for fabricating one or more integrated circuits;
    foaming the polymer layer to form a foamed polymer layer having a surface and a foamed polymer layer thickness, the foamed polymer layer thickness is greater an the polymer layer thickness by a factor of about between about 2.8 and 3.2;
    treating the surface to make the surface hydrophobic; and
    forming an interconnection conductive structure for the one or more integrated circuits in the foamed polymer layer.

16. The method of claim 15, wherein forming a polymer layer includes forming a layer of parylene containing silane followed by a low temperature bake.

17. The method of claim 15, wherein the method further includes curing the polymer layer before foaming the polymer layer.

18. A method of forming an insulator comprising:
    forming a polymer layer having a thickness on a substrate from a polymer having a silane additive, the substrate providing a base for fabricating one or more integrated circuits;
    foaming the polymer layer to form a foamed polymer layer having a surface and a foamed polymer layer thickness, the foamed polymer layer thickness is greater than the polymer layer thickness;
    exposing the surface to a gas to make the surface hydrophobic; and
    forming an interconnection conductive structure for the one or more in grated circuits in the foamed polymer layer.

19. The method of claim 18, wherein exposing the surface to a as comprises:
exposing the surface to methane.

20. The method of claim 18, wherein exposing the surface to a gas comprises:
passing a methane gas through a plasma to form a plurality of methane radicals; and
exposing the surface to at least some of the plurality of methane radicals.

21. A method of forming an insulator comprising:
forming a polymer layer having a thickness on a substrate from a polymer having a silane additive, the substrate providing a base for fabricating one or more integrated circuits;
foaming the polymer layer to form a foamed polymer layer having a surface, a cell size, and a foamed polymer layer thickness, the foamed polymer layer thickness is greater than the polymer layer thickness, and the cell size is less than about one-tenth of a micron;
exposing the surface to a gas to make the surface hydrophobic; and
forming an interconnection conductive structure for the one or more integrated circuits in the foamed polymer layer.

22. The method of claim 21, wherein exposing the surface to a gas includes exposing the surface to methane.

23. The method of claim 21, wherein exposing the surface to a gas includes:
passing a methane gas through a plasma to form a plurality of methane radicals; and
exposing the surface to at least some of the plurality of methane radicals.

24. A method of forming an insulator comprising:
forming an aerogel layer on a substrate that provides a base for fabricating one or more integrated circuits,
foaming the aerogel layer to form a foamed aerogel layer having a surface;
treating the surface to make the surface hydrophobic; and
forming an interconnection conductive structure for the one or more integrated circuits in the foamed aerogel layer.

25. The method of claim 24, wherein forming an aerogel layer having a surface on a substrate comprises:
forming an aerogel layer having a cell size of less than one micron.

26. The method of claim 24, wherein forming an aerogel layer having a surface on a substrate comprises:
forming an aerogel layer having a cell size of less than one-tenth micron.

27. The method of claim 24, wherein treating the surface to make the surface hydrophobic comprises:
exposing the surface to methane radicals.

28. The method of claim 24, wherein treating the surface to make the surface hydrophobic comprises:
forming a plurality of methane radicals using a high frequency electric field; and
exposing the surface to at least some of the plurality of methane radicals.

29. A method of forming a conductive structure comprising:
forming a material layer having a material layer thickness on a substrate;
foaming the material layer to form a foamed material layer having a surface and a foamed thickness, the foamed thickness being greater than the material layer thickness;
treating the surface to make the surface hydrophobic;
forming channels in the foamed material layer; and
filling the channels with a metal.

30. The method of claim 29, wherein filling the channels with a metal includes filling the channels with a metal selected from a group consisting of silver, aluminum, gold, copper, tungsten, and alloys of silver, aluminum, gold, copper, and tungsten.

31. The method of claim 29, wherein forming channels in the foamed material layer includes:
applying a photoresist to the surface of the foamed material layer;
forming patterns for the channels in the photoresist; and
etching the photoresist.

32. A method of forming a conductive structure comprising:
forming a polymer layer having a thickness on a substrate that provides a base for fabricating one or more integrated circuits, the polymer layer having a silane additive;
foaming the polymer layer to form a foamed polymer layer having a surface and a foamed polymer layer thickness, the foamed polymer layer thickness greater than the polymer layer thickness;
exposing the surface to a gas to make the surface hydrophobic;
forming channels in the foamed material layer; and
filling the channels with a metal.

33. The method of claim 32, wherein foaming the polymer layer includes forming a foamed polymer layer having a thickness of between about 1.8 and 2.0 microns.

34. The method of claim 32, wherein foaming the polymer layer includes forming a foamed polymer layer of polyimide containing silane.

35. The method of claim 34, wherein the method further include curing a layer of polyimide containing silane before foaming the layer of polyimide containing lane.

36. A method of forming a conductive structure comprising:
forming a foamed aerogel layer on a substrate that provides a base for fabricating one or more integrated circuits, the aerogel layer having a surface;
treating the surface to make the surface hydrophobic;
forming channels in the foamed aerogel layer; and
filling the channels with a metal.

37. The method of claim 36, wherein forming a foamed aerogel layer includes
applying an aerogel to the substrate;
spinning the substrate; and
curing the aerogel.

38. The method of claim 36, wherein filling the channels with metal includes filling the channels with a metal selected from a group consisting of silver, aluminum, gold, copper, tungsten, and alloys of silver, aluminum, gold, copper, and tungsten.

39. The method of claim 36, wherein forming channels in the foamed aerogel layer includes:
applying a photoresist to the surface of the foamed material layer;
forming patterns for the channels in the photoresist; and
etching the photoresist.

* * * * *

UNITED STATES PATENT AND TRADEMARK OFFICE
CERTIFICATE OF CORRECTION

PATENT NO. : 6,872,671 B2
DATED : March 29, 2005
INVENTOR(S) : Farrar

It is certified that error appears in the above-identified patent and that said Letters Patent is hereby corrected as shown below:

<u>Title page,</u>
Item [74], *Attorney, Agent or Firm*, delete "Lunderg" and insert -- Lundberg --, therefor.

<u>Column 7,</u>
Line 18, delete "at" and insert -- that --, therefor.
Line 50, after "on" insert -- a --.

<u>Column 8,</u>
Line 41, delete "an" and insert -- than --, therefor.
Line 66, delete "in grated" insert -- integrated --, therefor.

<u>Column 9,</u>
Line 2, delete "as" and insert -- gas --, therefor.

<u>Column 10,</u>
Line 38, delete "include" and insert -- includes --, therefor.
Line 39, delete "lane" insert -- silane --, therefor.
Line 55, insert -- a -- before "metal includes".

Signed and Sealed this

Seventh Day of June, 2005

JON W. DUDAS
*Director of the United States Patent and Trademark Office*